(12) United States Patent
Pretti et al.

(10) Patent No.: US 8,772,163 B2
(45) Date of Patent: Jul. 8, 2014

(54) SEMICONDUCTOR PROCESSING METHOD AND SEMICONDUCTOR STRUCTURE

(75) Inventors: Dennis J. Pretti, Boise, ID (US); Terrence B. McDaniel, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 190 days.

(21) Appl. No.: 13/485,875

(22) Filed: May 31, 2012

(65) Prior Publication Data
US 2013/0320502 A1 Dec. 5, 2013

(51) Int. Cl.
*H01L 21/44* (2006.01)
*H01L 21/461* (2006.01)
*H01L 21/302* (2006.01)

(52) U.S. Cl.
USPC ............ 438/668; 438/738; 438/672; 438/714

(58) Field of Classification Search
USPC .................................. 438/668, 672, 714, 738
See application file for complete search history.

(56) References Cited

U.S. PATENT DOCUMENTS

| | | | |
|---|---|---|---|
| 6,894,364 B2 * | 5/2005 | Hao et al. | 257/532 |
| 8,071,456 B2 * | 12/2011 | Moniwa et al. | 438/381 |
| 8,552,486 B2 * | 10/2013 | Wu et al. | 257/303 |
| 2002/0113317 A1 * | 8/2002 | Okushima | 257/774 |
| 2007/0069384 A1 * | 3/2007 | Watanabe | 257/758 |

* cited by examiner

*Primary Examiner* — Luan C Thai
(74) *Attorney, Agent, or Firm* — Winston Hsu; Scott Margo

(57) ABSTRACT

A semiconductor processing method that can generate a hole with different diameters, comprising: providing first material and second material different from the first material; and utilizing a etching process to etch the first material and the second material to form a hole through the first material and the second material; wherein the etching process has different etching rates for the first material and the second material such that the hole have different diameters. A semiconductor structure corresponding to the above-mentioned method is also disclosed.

12 Claims, 3 Drawing Sheets

SEMICONDUCTOR PROCESSING METHOD AND SEMICONDUCTOR STRUCTURE

BACKGROUND OF THE INVENTION

1. Field of the Invention

The present invention relates to a semiconductor processing method and a semiconductor structure, and particularly relates to a semiconductor processing method and a semiconductor structure that can adjust hole diameter via a single etching process.

2. Description of the Prior Art

In a semiconductor structure, a contact is utilized to contact metal and another feature. However, in some cases, the diameter of the same contact may need to be changed rather than remains constant. FIG. 1 is a schematic diagram illustrating a prior contact h. As shown in FIG. 1, the contact h0 is desired to contacts a target feature 101 but avoids contacting the non target feature 103. In order to manufacture such structure, a well controlled step forming the contact h0 such as an etching step is needed to generate a contact with accurate diameters. However, since the electronic device is getting tiny day by day, smaller diameter of the contact is needed thus the step of forming the contact h0 with desired diameter is getting harder to be controlled.

Besides, related skills may desire to reduce diameter of the contact when it is near the non target feature 103, as shown by the dotted line in FIG. 1. However, such process needs more steps than a normal process. For example, an first etching step is needed to form the part ha of the hole h0, which has a smaller diameter, then a second etching step is performed to form the part hb of the hole h, which has a larger diameter. These steps increase manufacturing time and are much harder to control than a normal process.

SUMMARY OF THE INVENTION

Therefore, one objective of the present invention is to provide a semiconductor processing method that can form a contact (or other kinds of holes) with different dimensions utilizing simple steps.

Another objective of the present invention is to provide a semiconductor structure having a contact (or other kinds of holes).

One embodiment of the present invention discloses: a semiconductor processing method that can generate a hole with different diameters, comprising: providing first material and second material different from the first material; and utilizing a etching process to etch the first material and the second material to form a hole through the first material and the second material; wherein the etching process has different etching rates for the first material and the second material such that the hole have different diameters.

A semiconductor structure corresponding to the above-mentioned method is also disclosed, which comprises: first material; second material different from the first material; and a hole with different diameters, through the first material and the second material, wherein the hole is formed by a single etching process etching the first material and the second material, wherein the etching process has a smaller etching rate for the first material than for the second material.

In view of above-mentioned embodiments, a desired hole diameter can be acquired without complex steps.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
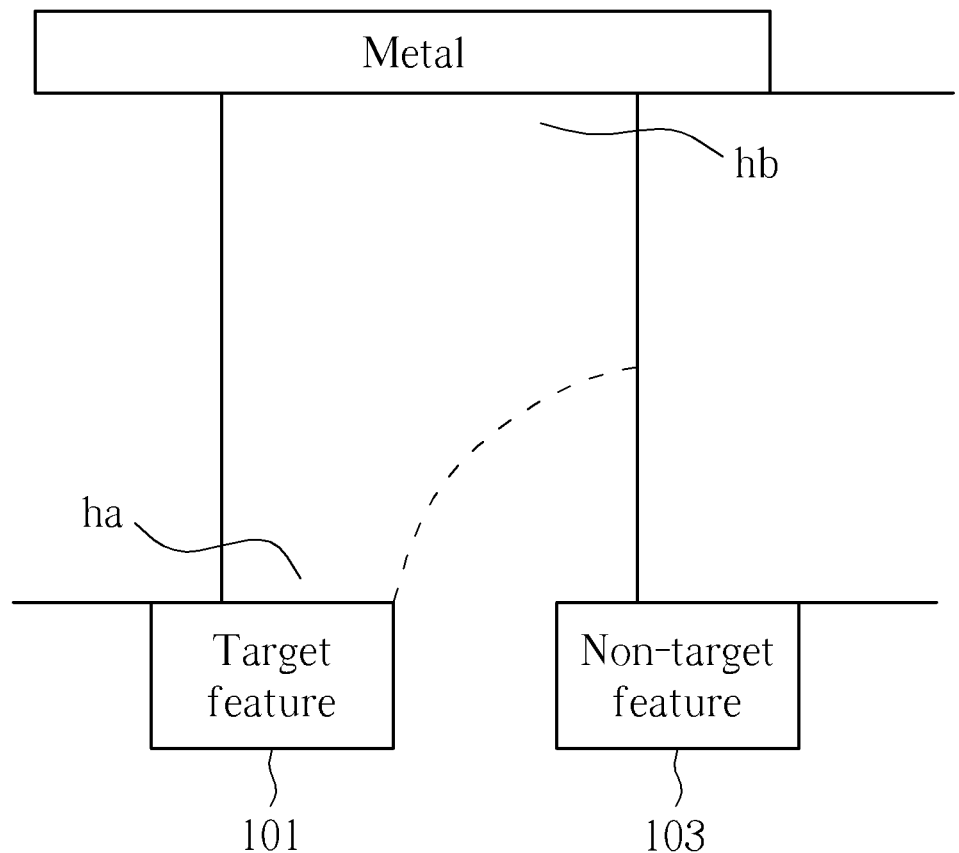
FIG. 1 is a schematic diagram illustrating a prior contact.
Figure 2:
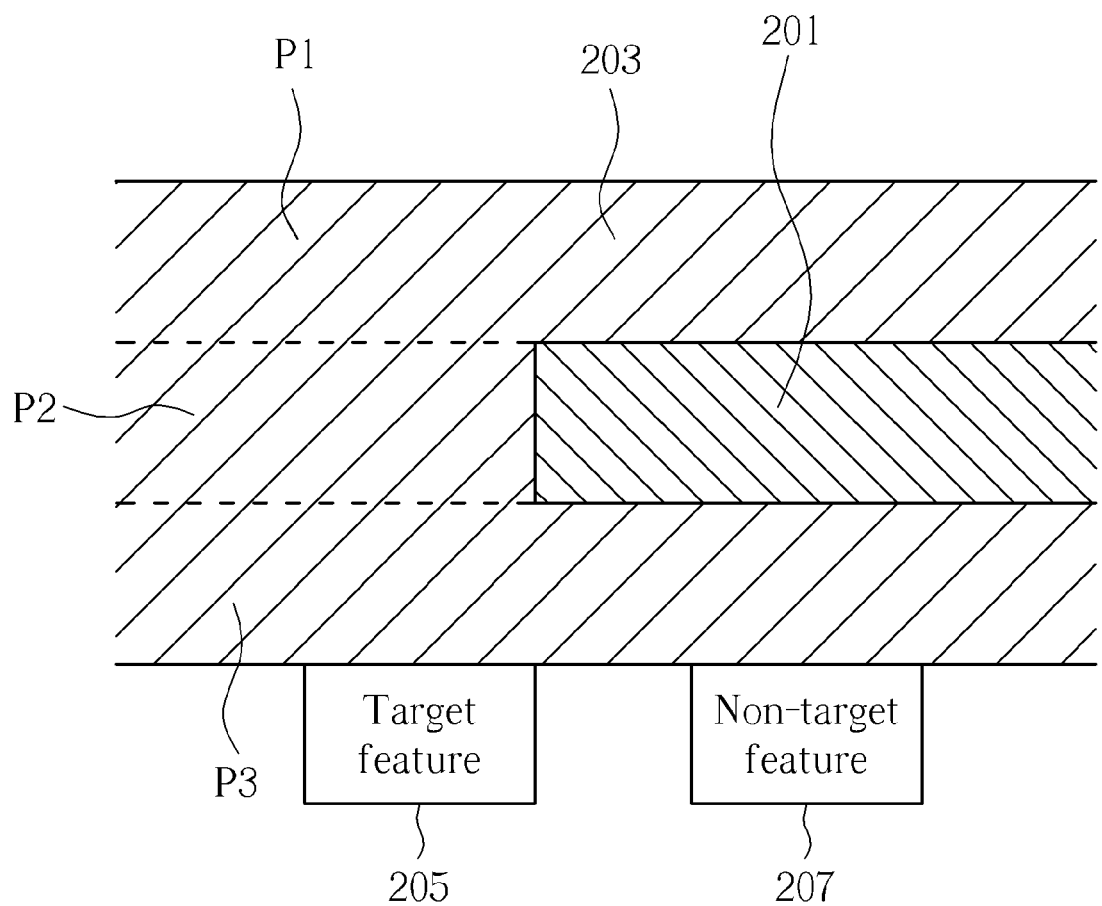
FIG. 2 and FIG. 3 are schematic diagrams illustrating the semiconductor processing method and semiconductor structure according to one embodiment of the present invention.
Figure 3:
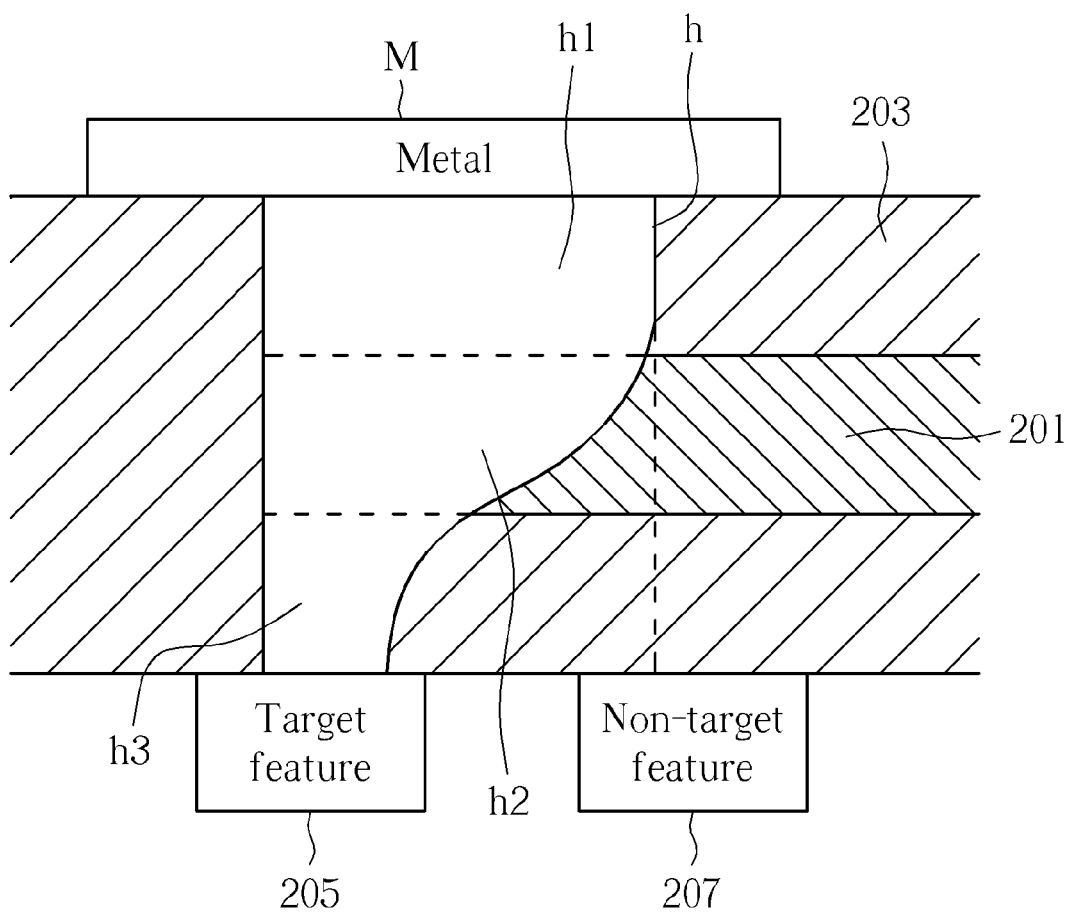

FIG. 2 and FIG. 3 are schematic diagrams illustrating the semiconductor processing method according to one embodiment of the present invention. As shown in FIG. 2, first material 201 (also named steering material) and second material 203 are provided. In this embodiment, the first material 201 is nitride and the second material 203 is oxide and the first material 201 is surrounded by the second material 203. Please note the target feature 205 and the non target feature 207 are included under the first material 201 and the second material 203 in FIG. 2, but these two devices are only for explaining one application of the present invention but do not mean to the present invention must have these two devices. Also, there are various kinds of methods known by persons skilled in the art to provide the first material 201 and the second material 203 as shown in FIG. 2, thus it is omitted for brevity here.

In FIG. 3, an etching step is processed to etch the first material 201 and second material 203, such that a hole h through the first material 201 and second material 203 is formed. The etching process has a smaller etching rate for the first material 201 than for the second material 203. Thereby the hole h can include a reduced diameter. The original diameter if only second material 203 is utilized is marked by dotted line in FIG. 3, which touches the non target feature 703. Via the utilizing of the first material 201, the diameter of the hole h can be reduced when hitting the first material 201. The diameter of the hole h under the first material 201 is reduced as well. By this way, the hole h can only contact the target feature 205 but avoids touching the non target feature 207. A metal line M can be provided above the second material 203. In this case, the hole h is a contact.

For more detail, the hole h includes a first portion h1, a second portion h2 under the first portion h1, and a third portion h3 under the second portion h2. The second portion h2 has a diameter smaller than the first portion h1. In this embodiment, the diameter of the second portion h2 gradually decreases from top to bottom. The third portion h3 has a diameter smaller than the second portion h2. The first portion h1 only touches the second material 203, that is, two sides of the first portion h1 are both the second material 203. The second portion h2 touches both the first material 201 and the second material 203. That is, one side of the second portion h2 is the first material 201 and the other side of the second portion h2 is the second material 203. Additionally, the third portion h3 only touches the second material 203, the same as the first portion h1.

One reason why the shape of the hole h in FIG. 3 can be formed is: Different anisotropic etch rates will cause a "steering" mechanism. As the etch rate slows in the material the diameter gests effectively smaller, the portion of the etch profile in oxide continues to etch, the portion hitting the nitride the etch rate slows and causes a shrinking of the diameter.

Please note the above-mentioned embodiments are only for example but do not mean to limit the scope of the present invention. For example, the first material 201 and the second material 203 can be materials other than oxide, nitride. Also, the structure in FIG. 2 can only include the part P1 having only the second material 203, and the part P2 having both the first material 201 and the second material 203. In this case the hole h in FIG. 3 have only the first portion h1 and the second portion h2. Also, the structure in FIG. 2 can only include the part P2 having both the first material 201 and the second material 203 and the part P3 having only the second material 203. In this case, the hole h in FIG. 3 have only the second portion h2 and the second portion h3.

In view of above-mentioned embodiments, a desired hole diameter can be acquired without complex steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor processing method that can generate a single hole with different diameters, comprising:
   providing first material and second material different from the first material; and
   utilizing a single etching process to etch the first material and the second material to form a single hole through the first material and the second material;
   wherein the single etching process has different etching rates for the first material and the second material such that the single hole have different diameters;
   where the single hole includes a second portion, and a third portion under the second portion;
   wherein the third portion has a diameter smaller than the second portion;
   where the second portion touches both the first material and the second material, and the third portion only touches the second material.

2. The semiconductor processing method of claim 1, wherein the first material is surrounded by the second material.

3. The semiconductor processing method of claim 1, wherein the first material is nitride, and the second material is oxide.

4. The semiconductor processing method of claim 1, further comprising:
   providing a target device before providing the first material and the second material; and
   providing a metal line above the second material, which can be contacted to the target device via the single hole.

5. The semiconductor processing method of claim 1,
   where the single hole further includes a first portion above the second portion;
   wherein the second portion has a diameter smaller than the first portion;
   where the first portion only touches the second material.

6. The semiconductor processing method of claim 1, wherein the diameter of the second portion gradually decreases from top to bottom.

7. A semiconductor structure having a single hole with different diameters, comprising:
   first material;
   second material different from the first material; and
   a single hole with different diameters, through the first material and the second material, wherein the single hole is formed by a single etching process etching the first material and the second material, wherein the single etching process has a smaller etching rate for the first material than for the second material;
   where the single hole includes a second portion, and a third portion under the second portion;
   wherein the third portion has a diameter smaller than the second portion;
   where the second portion touches both the first material and the second material, and the third portion only touches the second material.

8. The semiconductor structure of claim 7, wherein the first material is surrounded by the second material.

9. The semiconductor structure of claim 7, wherein the first material is nitride, and the second material is oxide.

10. The semiconductor structure of claim 7, further comprising:
    a target device under the first material and the second material; and
    a metal line above the second material, which can be contacted to the target device via the single hole.

11. The semiconductor structure of claim 7,
    where the single hole further includes a first portion above the second portion;
    wherein the second portion has a diameter smaller than the first portion;
    where the first portion only touches the second material.

12. The semiconductor structure of claim 7, wherein the diameter of the second portion gradually decreases from top to bottom.

* * * * *